United States Patent
Sud

(10) Patent No.: US 10,437,664 B2
(45) Date of Patent: Oct. 8, 2019

(54) INTERFERENCE SUPPRESSION USING REPEATED REDUCED RANK ADAPTIVE FILTERING IN FRACTIONAL FOURIER TRANSFORM (FRFT) DOMAINS

(71) Applicant: The Aerospace Corporation, El Segundo, CA (US)

(72) Inventor: Seema Sud, Reston, VA (US)

(73) Assignee: The Aerospace Corporation, El Segundo, CA (US)

( * ) Notice: Subject to any disclaimer, the term of this patent is extended or adjusted under 35 U.S.C. 154(b) by 190 days.

(21) Appl. No.: 15/698,697

(22) Filed: Sep. 8, 2017

(65) Prior Publication Data

US 2019/0079825 A1 Mar. 14, 2019

(51) Int. Cl.
| | |
|---|---|
| *H03M 13/00* | (2006.01) |
| *G06F 11/07* | (2006.01) |
| *G06F 7/48* | (2006.01) |
| *H03H 17/02* | (2006.01) |

(52) U.S. Cl.
CPC ............ *G06F 11/0793* (2013.01); *G06F 7/48* (2013.01); *G06F 11/0751* (2013.01); *H03H 17/0213* (2013.01)

(58) Field of Classification Search
CPC ..... H04L 25/03159; H04L 2025/03426; H04L 2025/03414; H04L 2025/03522; H04L 2025/03535; H04L 2025/03726; H04L 25/0202; H04L 25/0212; H04L 25/022; H04L 25/0222; H04L 1/20; H04L 25/03038; H04L 25/067; G06F 11/0793; G06F 7/48; G06F 11/0751; G06F 3/167; G06F 3/015; H03H 17/0213; G10L 15/25; G10L 15/30; G10L 15/02; G10L 15/28; A61B 5/04886; H04B 1/525; H04B 1/0475; H04W 80/04
See application file for complete search history.

(56) References Cited

PUBLICATIONS

Almeida, L.B., "The Fractional Fourier Transform and Time-Frequency Representation", IEEE Trans. on Sig. Proc., vol. 42, No. 11, Nov. 1994.
Candan et al., "The Discrete Fractional Fourier Transform", IEEE Trans on Sig. Proc., vol. 48, pp. 1329-1337, May 2000.
Goldstein, J.S., "Optimal Reduced Rank Statistical Signal Processing, Detection, and Estimation Theory", Ph.D. Thesis, Dept. of Electrical Engineering, University of Southern California, Los Angeles, CA, Dec. 1997.

(Continued)

*Primary Examiner* — Guerrier Merant
(74) *Attorney, Agent, or Firm* — LeonardPatel PC

(57) ABSTRACT

A signal-of-interest (SOI) may be separated from interference and/or noise using repeated reduced rank minimum mean-square error Fractional Fourier Transform (MMSE-FrFT) filtering and a low rank adaptive multistage Wiener filter (MWF). A number of stages in the MWF, L, may be chosen such that at the $L^{th}$ stage, the MSE between the SIM estimate and the true SW is less than or equal to an error threshold $\in$ (e.g., $\in=0.001$). By combining these filtering techniques, significant improvement in reducing the mean-square error (MSE) may be realized over single stage MMSE-FrFT, repeated MMSE-FrFT, and MMSE-FFT algorithms—indeed, by an order of magnitude or more.

31 Claims, 12 Drawing Sheets

(56) References Cited

PUBLICATIONS

Kutay et al., "Optimal Filtering in Fractional Fourier Domains", Bilkent University, Dept. of Electrical Engineering, Bilkent, Ankara, Turkey, 1995.

Kutay et al., "Optimal Filtering in Fractional Fourier Domains", IEEE Trans. on Sig. Proc., vol. 45, No. 5, May 1997.

Ozaktas et al., "The Fractional Fourier Transform With Applications in Optics and Signal Processing", John Wiley and Sons, West Sussex, England, 2001.

Ricks et al., "Efficient Architectures for Implementing Adaptive Algorithms", Proc. of the 2000 Antenna Applications Symposium, pp. 29-41, Allerton Park, Monticello, Illinois, Sep. 20-22, 2000.

Subramaniam et al., "Filtering in Rotated Time-Frequency Domains with Unknown Noise Statistics", IEEE Trans. on Sig. Proc., vol. 60, No. 1, Jan. 2012.

Sud, S., "Interference Cancellation by Repeated Filtering in the Fractional Fourier Transform Domain Using Mean-Square Error Convergence", Int. Journal of Engineering, Research, and Applications (IJERA), vol. 6, No. 5, Part 2, pp. 43-47, May 2016.

Sud, S., "Performance of Adaptive Filtering Techniques Using the Fractional Fourier Transform for Non-Stationary Interference and Noise Suppression", Int. J. of Enhanced Research in Science, Technology, and Engr., (IJERSTE), vol. 4, No. 10 pp. 116-122, Oct. 2015.

RELATED ART

INTERFERENCE SUPPRESSION USING REPEATED REDUCED RANK ADAPTIVE FILTERING IN FRACTIONAL FOURIER TRANSFORM (FRFT) DOMAINS

FIELD

The present invention generally pertains to signal separation and interference suppression, and more specifically, to separating a signal-of-interest (SOI) from interference and/or noise using repeated reduced rank minimum mean-square error Fractional Fourier Transform (MMSE-FrFT) filtering and a low rank adaptive multistage Wiener filter (MWF).

BACKGROUND

The Fractional Fourier Transform (FrFT) has a wide range of applications in fields such as optics, quantum mechanics, image processing, and communications. The FrFT of a function $f(x)$ of order a is defined as $$F^a[f(x)] = \int_{-\infty}^{\infty} B_a(x,x') f(x') dx' \quad (1)$$

where the kernel $B_a(x, x')$ is defined as $$B_a(x, x') = \frac{e^{i(\pi\hat{\phi}/4 - \phi/2)}}{|\sin(\phi)|^{1/2}} \times e^{i\pi(x^2 \cot(\phi) - 2xx' \csc(\phi) + x'^2 \cot(\phi))} \quad (2)$$

where $\phi = a\pi/2$ and $\hat{\phi} = \text{sgn}[\sin(\phi)]$. This applies to the range $0 < |\phi| < \pi$, or $0 < |a| < 2$. In discrete time, the N×1 FrFT of an N×1 vector can be modeled as $$X_a = F^a x \quad (3)$$

where $F^a$ is an N×N matrix whose elements are given by $$F^a[m,n] = \sum_{k=0, k \neq (N-1+(N)_2)}^{N} u_k[m] e^{-j\frac{\pi}{2}ka} u_k[n] \quad (4)$$

and where $u_k[m]$ and $u_k[n]$ are the eigenvectors of the matrix S defined by $$S = \begin{pmatrix} C_0 & 1 & 0 & \cdots & 1 \\ 1 & C_1 & 1 & \cdots & 0 \\ 0 & 1 & C_2 & \cdots & 0 \\ \vdots & \vdots & \vdots & \ddots & \vdots \\ 1 & 0 & 0 & \cdots & C_{N-1} \end{pmatrix} \text{ and} \quad (5)$$

$$C_n = 2 \cos\left(\frac{2\pi}{N}n\right) - 4 \quad (6)$$

The FrFT is a useful approach for separating a signal-of-interest (SOI) from interference and/or noise when the statistics of either are non-stationary (i.e., at least one device is moving, Doppler shift occurs, time-varying signals exist, there are drifting frequencies, etc.). The FrFT enables translation of the received signal to an axis in the time-frequency plane where the SOI and interference/noise are not separable in the frequency domain, as produced by a conventional Fast Fourier Transform (FFT), or in the time domain. Various algorithms for estimating the best rotational parameter a and applications using FrFTs have been developed.

Signal separation using the FrFT can be visualized using the concept of a Wigner Distribution (WD). The WD is a time-frequency representation of a signal. The WD may be viewed as a generalization of the Fourier Transform, which is solely the frequency representation. The WD of a signal x(t) can be written as $$W_x(t,f) = \int_{-\infty}^{\infty} x(t+\tau/2) x^*(t-\tau/2) e^{-2\pi j \tau f} d\tau \quad (7)$$

The projection of the WD of a signal x(t) onto an axis $t_a$ gives the energy of the signal in the FrFT domain a, $|X_a(t)|^2$. Letting $\alpha = a\pi/2$, this may be written as $$|X_a(t)|^2 = \int_{-\infty}^{\infty} W_x(t \cos(\alpha) - f \sin(\alpha), t \sin(\alpha) + f \cos(\alpha)) df \quad (8)$$

In discrete time, the WD of a signal x[n] can be written as $$W_x\left[\frac{n}{2f_s}, \frac{kf_s}{2N}\right] = e^{j\frac{\pi}{N}kn} \sum_{m=l_1}^{l_2} x[m] x^*[n-m] e^{j\frac{2\pi}{N}km} \quad (9)$$

where $l_1 = \max(0, n-(N-1))$ and $l_2 = \min(n, N-1)$. This particular implementation of the discrete WD is valid for non-periodic signals. Aliasing is avoided by oversampling the signal x[n] using a sampling rate $f_s$ (samples per second) that is at least twice the Nyquist rate.

The WD of an SOI and interference illustrates the benefit of filtering with the FrFT. See graph 100 of FIG. 1. In non-stationary environments, the SOI x(t) and interference $x_I(t)$ vary as a function of time and frequency. The channel, too, will vary similarly. The two signals overlap in the time domain ($t_{a=0}$) and in the frequency domain ($t_{a=1}$), so they cannot be completely separated using either of these axes. This means that conventional time-based and frequency-based techniques, such as MMSE filtering and FFT analysis, respectively, will not achieve good signal separation. The FrFT can be used to seek the axes where the signals overlap the least, and hence can best be separated.

Repeated FrFT domain filtering can improve separation capability even further. In FIG. 1, two rotations are required to completely filter out the interference. First, rotate to $a_1$, $0 < a_1 < 2$, to filter out the upper portion of the interfering signal $x_I(t)$, and then rotate to $a_2$, $0 < a_2 < 2$, to filter out the remaining lower part of $x_I(t)$. In Sud, S., "Interference Cancellation by Repeated Filtering in the Fractional Fourier Transform Domain Using Mean-Square Error Convergence", Int. Journal of Engineering Research and Applications (IJERA), Vol. 6, No. 5, Part-2, pp. 43-47 (May 2016), the optimum rotational axes are found by searching, using an MMSE criterion, which resulted in improvement in mean-square error (MSE) over the single stage filter. However, further improvement in performance is still possible. Accordingly, an improved MMSE-FrFT approach may be beneficial.

SUMMARY

Certain embodiments of the present invention may be implemented and provide solutions to the problems and needs in the art that have not yet been fully solved by conventional signal separation approaches and systems. For example, some embodiments of the present invention outperform the repeated MMSE filtering method described in "Interference Cancellation by Repeated Filtering in the Fractional Fourier Transform Domain Using Mean-Square Error Convergence" by performing the repeated FrFT domain filtering using a low rank adaptive multistage Wiener filter (MWF). Such a MWF is described, for example, in Sud, S., "Performance of Adaptive Filtering Techniques Using the Fractional Fourier Transform for Non-Stationary Interference and Noise Suppression", Int. J. of Enhanced Research in Science, Technology, and Engr. (IJERSTE), Vol. 4, No. 10, pp. 116-122 (October 2015). The number of stages in the MWF, L, is chosen in some embodiments such that at the $L^{th}$ stage, the MSE between the SOI estimate and the true SOI is less than or equal to an error threshold $\in =0.001$. However, E may be any desired number (e.g., $10^{-4}$, $10^{-5}$, $2.34 \times 10^{-7}$, etc.) without deviating from the scope of the invention. By combining these filtering techniques, significant improvement in reducing the MSE is realized.

In one embodiment, a computer-implemented method of performing repeated reduced rank MMSE-MWF-FrFT filtering includes computing, by a computing system, MMSE filter coefficients over all a for a current optimum filter to be applied to a received signal, where a is a rotational parameter. The computer-implemented method also includes computing, by the computing system, a best a for the current filter and a current smallest MMSE. The computer-implemented method further includes updating the received signal, by the computing system, using the current smallest MMSE. When the current smallest MMSE is not less than or equal to an error threshold, the computer-implemented method includes repeating, by the computing system, the computation of the MMSE filter coefficients, the computation of the best a and the current smallest MMSE, and the updating of the received signal using the current smallest MMSE until the current smallest MMSE is less than or equal to the error threshold. When the current smallest MMSE is less than or equal to the error threshold, the computer-implemented method includes extracting an SOI, by the computing system, from the updated received signal.

In another embodiment, a computer program configured to perform repeated reduced rank MMSE-MWF-FrFT filtering is embodied on a non-transitory computer-readable medium. The program is configured to cause at least one processor to: (1) compute minimum mean-square error (MMSE) filter coefficients over all values of a rotational parameter a for a current optimum filter to be applied to a received signal; (2) compute a best value of a and compute a current smallest MMSE; (3) update the received signal using the current smallest received signal; and (4) while the current smallest MMSE is greater than an error threshold, repeat steps (1)-(3) until the current smallest MMSE is less than or equal to the error threshold. When the error threshold is reached or exceeded, L sets of a values and filter weights are provided to be applied to data in the received signal following a training sequence.

In yet another embodiment, a computing system includes memory storing computer program instructions for performing repeated reduced rank MMSE-MWF-FrFT filtering and at least one processor configured to execute the computer program instructions. The instructions, together with the at least one processor, are configured to cause the apparatus to apply reduced rank MMSE-MWF-FrFT filtering to a received signal for at least one stage L, obtaining a current smallest MMSE at each stage, and extract a SOI from the updated received signal when the current smallest MMSE is less than or equal to an error threshold. When the error threshold is reached or exceeded, L sets of a values and filter weights are provided to be applied to data in the received signal following a training sequence to extract the SOI from the received signal.

BRIEF DESCRIPTION OF THE DRAWINGS

In order that the advantages of certain embodiments of the invention will be readily understood, a more particular description of the invention briefly described above will be rendered by reference to specific embodiments that are illustrated in the appended drawings. While it should be understood that these drawings depict only typical embodiments of the invention and are not therefore to be considered to be limiting of its scope, the invention will be described and explained with additional specificity and detail through the use of the accompanying drawings, in which.

according to an embodiment of the present invention, with a Gaussian pulse interferer where $E_b/N_0=0$ dB and CIR=0 dB.

Figure 11:
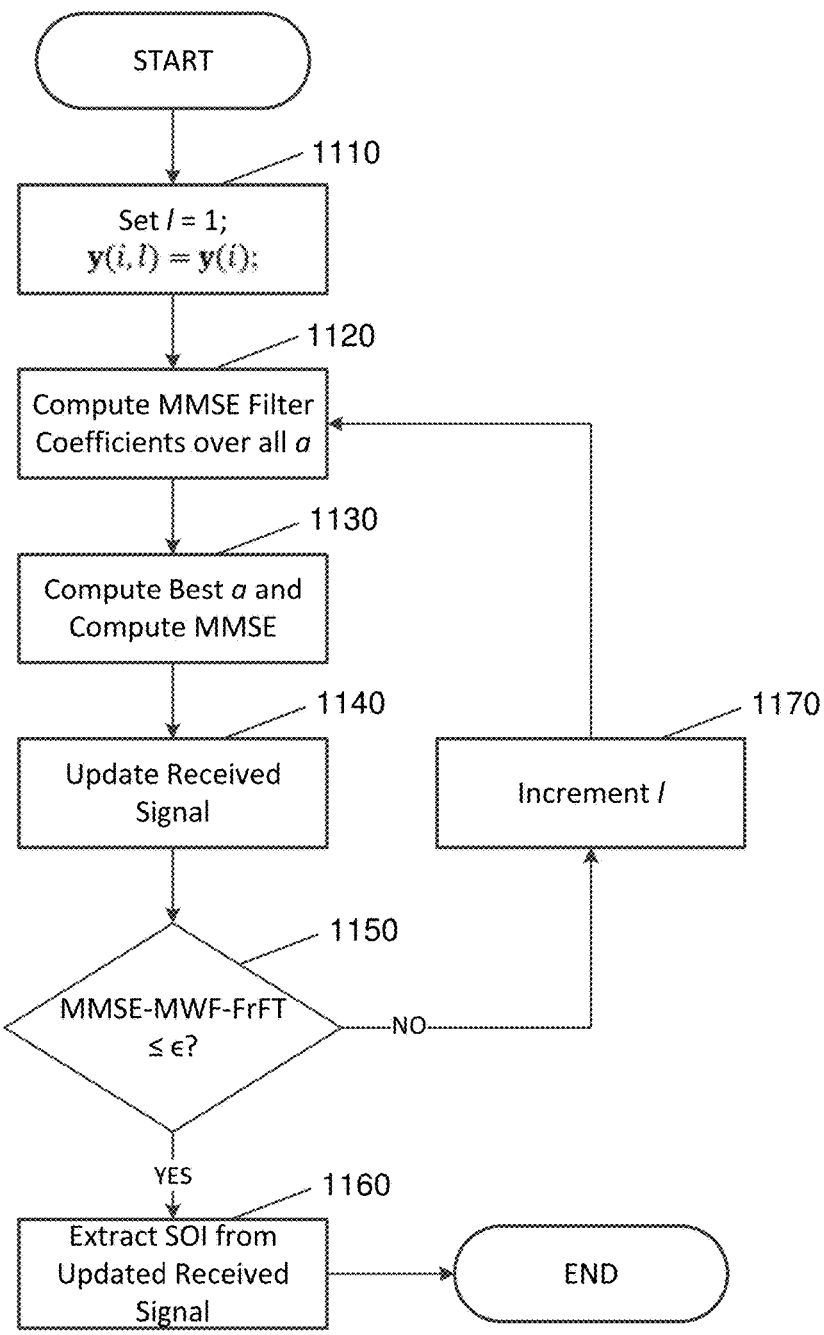

FIG. 11 is a flowchart 1100 illustrating a process for performing repeated reduced rank adaptive filtering with a MMSE-MWF-FrFT approach, according to an embodiment of the present invention.

Figure 12:
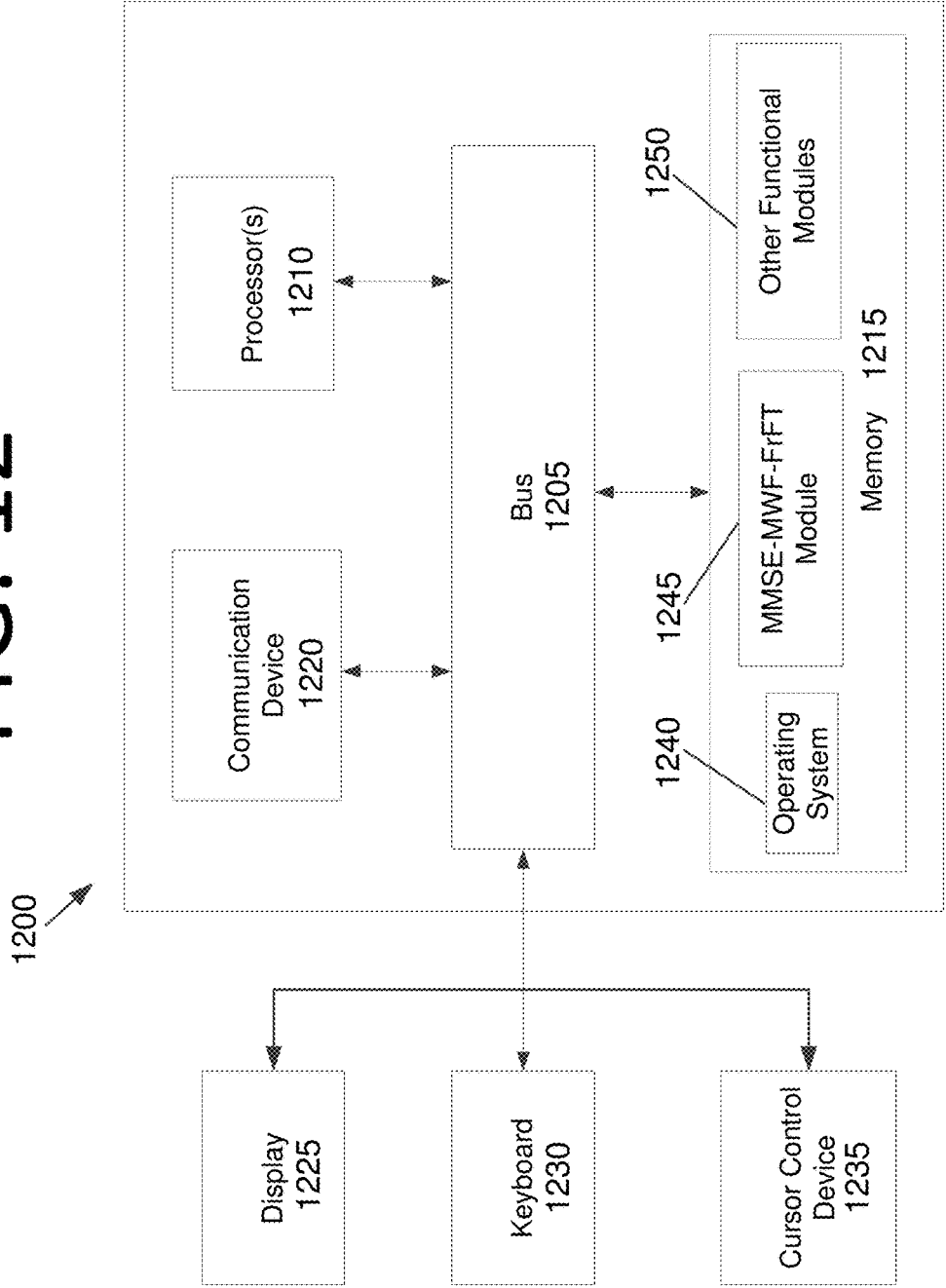

FIG. 12 illustrates a computing system 1200 configured to perform repeated reduced rank adaptive filtering with a MMSE-MWF-FrFT approach, according to an embodiment of the present invention.

DETAILED DESCRIPTION OF THE EMBODIMENTS

Some embodiments of the present invention pertain to separating an SOI from interference and/or noise using repeated reduced rank MMSE-FrFT filtering and a low rank adaptive MWF. The number of stages in the MWF, L, is chosen in some embodiments such that at the $L^{th}$ stage, the MSE between the SOI estimate and the true SOI is less than or equal to an error threshold $\in=0.001$. By combining these filtering techniques, significant improvement in reducing the MSE may be realized over single stage MMSE-FrFT, repeated MMSE-FrFT, and MMSE-FFT algorithms indeed, by an order of magnitude or more.

Signal Model

The SOI in some embodiments is modeled as a digital, baseband binary phase shift keying (BPSK) signal whose elements are in $(-1, +1)$. This is due to the fact that the carrier is ignored. The number of bits per block is denoted $N_1$, and if each bit is oversampled by a factor of samples per bit (SPB), the number of samples per block in the BPSK signal is $N=N_1 SPB$. The signal is denoted in discrete time, vector form as the N×1 vector x(i). This SOI is corrupted by a non-stationary interferer h(i), and by an additive white Gaussian noise (AWGN) signal n(i). There may instead be a non-stationary interferer $x_I(i)$ that is corrupting the SOI. Here, index i denotes the $i^{th}$ sample, where i=1, 2, ..., N. The received signal y(i) is then $$y(i)=(x(i)*h(i))+x_I(i)+n(i) \qquad (10)$$

where * denotes convolution. The goal is to estimate x(i) in the presence of the non-stationary channel h(i), and/or the non-stationary interference $x_I(i)$. An estimate of the transmitted signal x(i), denoted $\hat{x}(i)$, is obtained by first transforming the received signal to the FrFT domain, applying an adaptive filter, and taking the inverse FrFT. This may be written as $$\hat{x}(i)=F^{-a}GF^a y(i) \qquad (11)$$

where $F^a$ and $F^{-a}$ are the N×N FrFT and inverse FrFT matrices of order a, respectively, and $$g=\text{diag}(G)=(g_0, g_1, \ldots, g_{N-1}) \qquad (12)$$

is an N×1 set of optimum filter coefficients to be found. The notation $\text{diag}(G)=(g_0, g_1, \ldots, g_{N-1})$ means that matrix G has the scalar coefficients $g_0, g_1, \ldots, g_{N-1}$ as its diagonal elements, with all other elements set equal to zero.

Repeated MMSE-FrFT Filtering

The algorithm in Eq. (11) may compute the signal estimate $\hat{x}(i)$ using the MMSE filtering technique described in Subramaniam, S., Ling, B. W., and Georgakis, A., "Filtering in Rotated Time-Frequency Domains with Unknown Noise Statistics", IEEE Trans. on Sig. Proc., Vol. 60, No. 1 (January 2012), but performs the filtering in stages, choosing the value of a at each stage for which the MSE between $\hat{x}(i)$ and x(i) is minimum. The search is performed for $0 \le a < 2$ using a step size of $\Delta a=0.01$ in some embodiments, which offers a good compromise between performance and complexity. The calculation is repeated by using an updated version of the received signal obtained from the previous estimate for l=1, 2, ..., L iterations. In other words, $\hat{x}(i)$ is set to y(i,l+1), where the variable l has been added to indicate the iteration. The MSE is then calculated again by searching for the best value of a in which the MSE is minimized. This could yield a different value of a than in the previous step. These steps are repeated in some embodiments until the MSE drops below the threshold $\in=0.001$ or reaches a plateau. The algorithm is summarized below. See Sud, S., "Interference Cancellation by Repeated Filtering in the Fractional Fourier Transform Domain Using Mean-Square Error Convergence," Int. Journal of Engineering Research and Applications (IJERA), Vol. 6, No. 5, Part-2, pp. 43-47 (May 2016).

Initialize:
l=1;
y(i,l)=y(i); % Received signal
% Iterate l=1, 2, ..., L
1. Compute MMSE filter coefficients for $0 \le a(l) < 2$.

$$g_{0,MMSE-FrFT}(i,l)=\tfrac{1}{2}Q^{-1}(i)b(i,l)$$

where $$Q(i,l)=(F^{-a(l)}Z(i))^H(F^{-a(l)}Z(i,l))$$

$$z(i,l)=\text{diag}(Z(i,l))=F^{a(l)}y(i,l)$$

$$b(i,l)=-2*\text{real}(x(i)^T \cdot \overline{Z}(i,l))$$

and $$\text{diag}(\overline{Z}(i,l))=F^{-a(l)}Z(i,l)$$

2. Compute the best a that minimizes the MSE and compute the MSE.

$$MMSE\text{-}FrFT(l) = \arg\min_{a(l)} \frac{1}{M} \sum_{i=1}^{M} \|\hat{x}(i,l) - x(i)\|^2$$

where $$\hat{x}(i,l)=F^{-a(l)}G_{0,MMSE-FrFT}(i,l)F^{a(l)}y(i,l)$$

3. Update the received signal using the new estimate.

$$y(i,l+1)=\hat{x}(i,l)$$

4. Increment l=l+1 for the next iteration.
5. Repeat steps 1-4 until $MMSE\text{-}FrFT(l) \le \in$.

Note that l=1 is a conventional MMSE-FrFT solution of Subramaniam et al., and l=1, a=1 is the conventional MMSE-FFT solution. All three of these algorithms are compared to the reduced rank approach of some embodiments later herein. In addition, note that the values a(l) computed by the above algorithm would be used in practice to filter the data present in the signal following the training sequence. As the statistics of the environment and channel change over time, a new training sequence would be used to update the a(l) values.

Repeated MMSE-MWF-FrFT Filtering

The MWF offers the advantages that it usually exceeds MMSE performance without requiring matrix conversion or eigen-decompositions. Hence, MWF is more computationally efficient. In some embodiments, the most computationally efficient version is used, called the correlation subtraction architecture (CSA-MWF). See Ricks, D. C., and Goldstein, J. S., "Efficient Architectures for Implementing Adaptive Algorithms", Proc. of the 2000 Antenna Applications Symposium, pp. 29-41, Allerton Park, Monticello, Ill. (Sep. 20-22, 2000). Rank reduction can be achieved because the number of filter stages D can be set to D<<N (e.g., D=5 and N=40). The filter is initialized as is performed conventionally in some embodiments, except that all of the variables are transformed to the FrFT domain first, and since the calculation is performed over l=1, 2, . . . , L stages, the variable l is used. Thus, let $$d_0(i,l) = (F^a x(i))^T \quad (13)$$

and $$x_0(i,l) = Z(i,l) \quad (14)$$

The CSA-MWF computes the D scalar weights $w_j$, j=1, 2, . . . , D, from which the optimum filter $$g_{0,MMSE\text{-}MWF\text{-}FrFT}(l) = w_1(l)h_1(l) - w_1(l)w_2(l)h_2(l) + \ldots - (-1)^D w_1(l)w_2(l) \ldots w_D(l) \quad (15)$$

is formed to compute the bit estimates $\hat{x}_{MWF}(i,l)$, as well as update the new estimated received signal y(i,l+1), as described above. The full algorithm, including recursion, is shown below.

Initialize:
l=1;
y(i,l)=y(i); % Received signal
% Iterate l=1, 2, . . . , L
1. Compute MMSE filter coefficients for 0≤a(l)<2.
   Initialize:

$$d_0(i,l) = (F^a x(i))^T \text{ \% Training signal}$$

$$x_0(i,l) = Z(i,l) \text{ \% Received signal}$$

where $$\text{diag}(Z(i,l)) = F^{a(l)}(y(i,l))$$

Forward recursion:
   For j=1, 2, . . . , D:

$$h_j(l) = (\Sigma_\Omega \{d^*_{j-1}(i,l)x_{j-1}(i,l)\})/(\|\Sigma_\Omega \{d^*_{j-1}(i,l)x_{j-1}(i,l)\}\|)$$

$$d_j(i,l) = h_j^H(l)x_{j-1}(i,l)$$

$$x_j(i,l) = x_{j-1}(i,l) - h_j(l)d_j(i,l)$$

Backward Recursion:

$$\epsilon_D(i) = d_D(i)$$

For j=D, D-1, . . . , 1:

$$w_j(l) = (\Sigma_\Omega \{d^*_{j-1}(i,l)\epsilon_j(i,l)\})/(\Sigma_\Omega \{|\epsilon_j(i,l)|^2\})$$

$$\epsilon_{j-1}(i,l) = d_{j-1}(i,l) - w^*_j(l)\epsilon_j(i,l)$$

2. Compute the best a that minimizes the MSE and compute the MMSE.

$$MMSE\text{-}FrFT(l) = \operatorname*{argmin}_{a(l)} \frac{1}{M} \sum_{i=1}^{M} \|\hat{x}_{MWF}(i,l) - x(i)\|^2$$

% a(l) appearing under "min" means that a(l) is chosen that minimizes the % expression. This value of a(l) is used to compute MMSE-FrFT(l).

where $$\hat{x}_{MWF}(i,l) = F^{-a(l)} G_{0,MMSE\text{-}MWF\text{-}FrFT}(i,l) F^{a(l)} y(i,l)$$

and $$g_{0,MMSE\text{-}MWF\text{-}FrFT}(l) = w_1(l)h_1(l) - w_1(l)w_2(l)h_2(l) + \ldots - (-1)^D w_1(l)w_2(l) \ldots w_D(l)h_D(l)$$

3. Update the received signal using the new estimate.

$$y(i,l+1) = \hat{x}_{MWF}(i,l)$$

4. Increment l=l+1 for the next iteration.
5. Repeat steps 1-4 until MMSE-MWF-FrFT(l)≤∈.

As shown in simulations that are discussed below, few iterations (i.e., L≤2) and a low rank (e.g., D=5) are typically needed to reduce the MSE by more than an order of magnitude over the repeated MMSE filtering approach of some embodiments, which may require L up to 3. However, in some embodiments, more than three stages may be required for MMSE to be less than or equal to the desired error threshold ∈. Both methods improve performance over the single iteration algorithm of Subramaniam et al., as well as the MMSE-FFT method, operating in the frequency domain only, under all types of interference and channel conditions that were studied.

Simulations

In all of the examples below, it is assumed that the SOI x(i) is a BPSK signal, $N_1$=10 bits per block, and SPB=4 samples per bit, so that N=40 samples. The number of stages (i.e., the rank) of the CSA-MWF is set to D=5. This is chosen arbitrarily since the CSA-MWF can usually operate at a very low rank, except in a dense co-channel environment, in which case the rank is slightly higher. It is first assumed that there is a non-stationary channel present, but no interference. The channel is modeled as a time-varying, bandpass signal whose center frequency is changing with time as $$h(i) = e^{-j2\pi \left(\frac{i}{f_s}\right)^2} \text{sinc}(i/f_s) + h_n(i) \quad (16)$$

where $f_s$=SPB·$R_b$ is the sampling rate, $R_b$ is the bit rate, and the chirped signal $h_n(i)$ is of the form $$h_n(i) = e^{-j2\pi \left(\frac{i}{f_s}\right)^2} \cdot n_l(i) \quad (17)$$

The term $n_l$ is filtered noise given by $$n_l(i) = \text{conv}(n_c(i), \text{filt}) \quad (18)$$

where $n_c(i)$ is the channel noise, modeled as white Gaussian noise (WGN) using a desired value of $E_b/N_0$, and the filtering function filt is a lowpass filter whose stopband attenuation is 20 dB and roll-off factor is α=0.5. The obtained bit estimates are plotted using the repeated MMSE filtering method and the repeated CSA-MWF method for l=1, 2, . . . , L to the maximum L required to obtain an MSE of ∈≤0.001. Also plotted are the transmitted signal x(i), the received signal y(i), and the l=1, a=1 signal (i.e., the FFT estimate). Note that the first MMSE estimate, MMSE-FrFT (1), is the MMSE-FrFT estimate in the conventional algorithm of Subramaniam et al. The best a at each iteration l is shown in each example.

Figure 1:
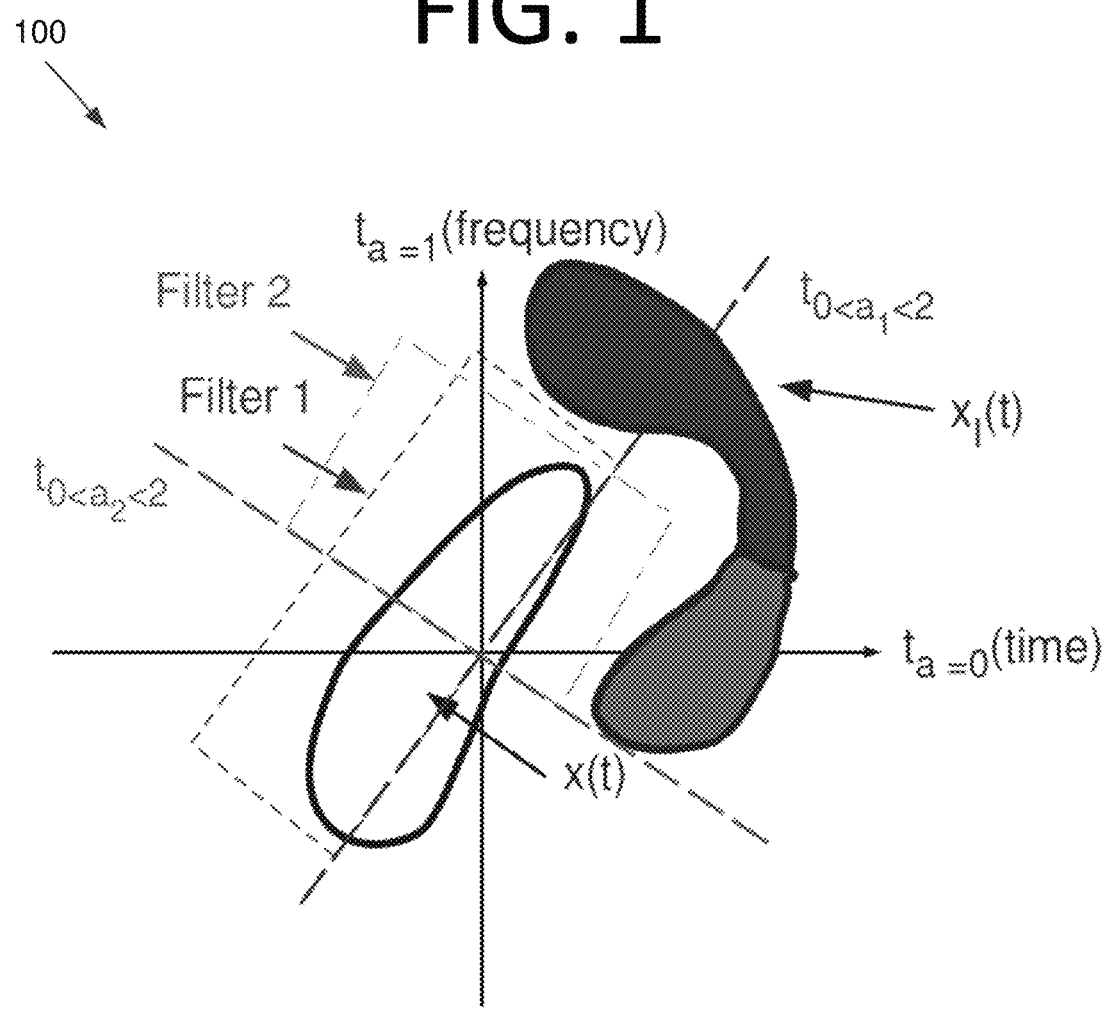
FIG. 1 is a graph 100 illustrating a Wigner Distribution (WD) of signal x(t) and interference $x_I(t)$ with optimum axes $t_{a_1}$ and $t_{a_2}$ for filtering out interference.
Figure 2:
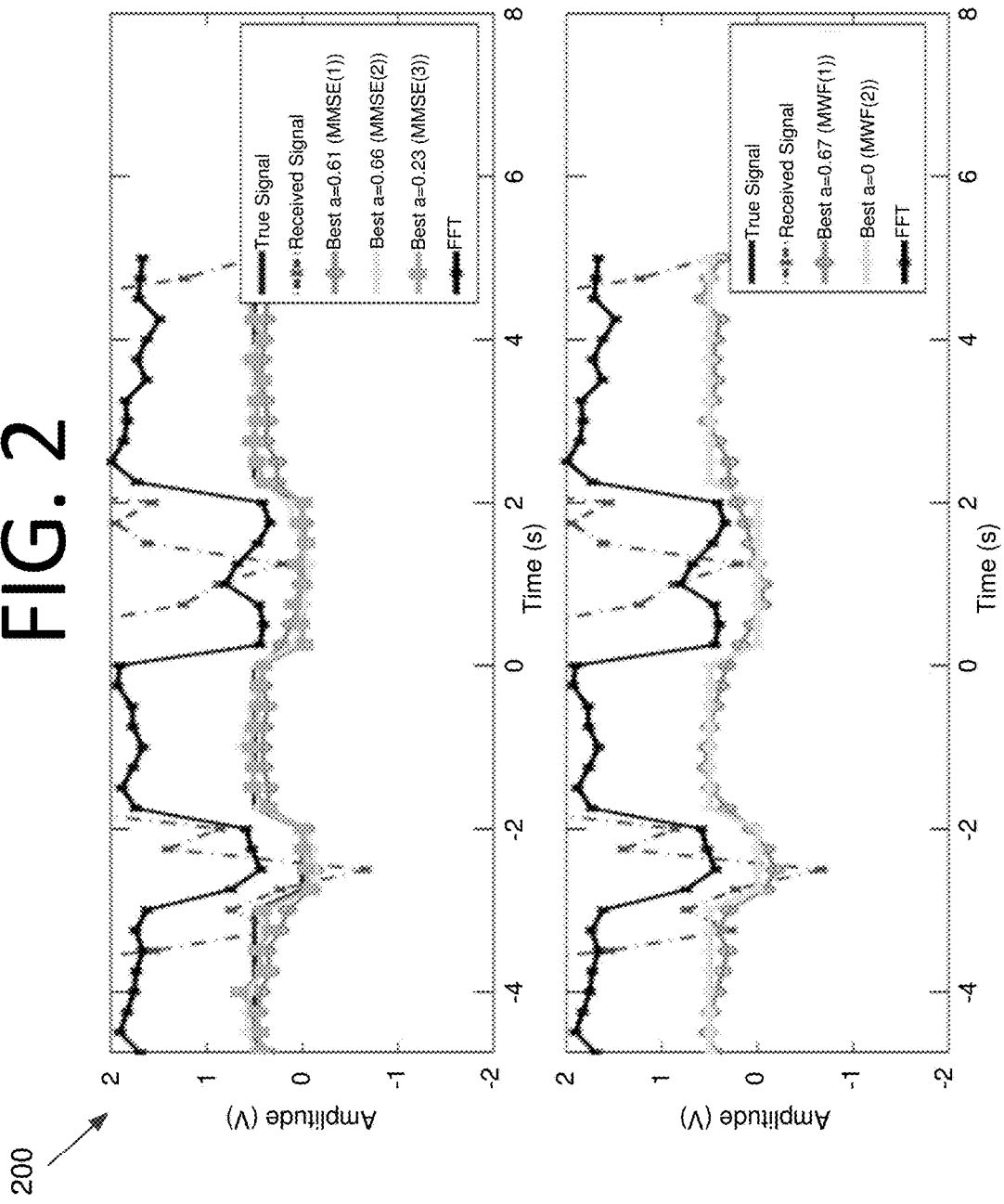
FIG. 2 illustrates graphs 200 showing signal amplitude over time for the best a values produced by repeated MMSE-FrFT filters and MMSE-FFT filters (upper graph) versus the MMSE-MWF-FrFT approach (lower graph) according to an embodiment of the present invention, where $E_b/N_0=5$ dB.

The first example in graphs 200 of FIG. 2 has $E_b/N_0$=5 dB. The MSEs were computed for the repeated MMSE-FrFT and MMSE-FFT filters as MMSE-FrFT(1)=0.0199, MMSE-FrFT(2)=0.0046, MMSE-FrFT(3)=0.0045, and MMSE-FFT=1.2045. For the CSA-MWF, MMSE-MWF-FrFT(1)=0.0099 and MMSE-MWF-FrFT(2)=2.63×10$^{-6}$ were obtained. With only L=2 stages, orders of magnitude of improvement were achieved over MMSE-FFT filtering and repeated MMSE-FrFT filtering. Note that the repeated MMSE-FrFT filtering method could not achieve the low MSE obtained by the technique of some embodiments, as it cannot reduce the MSE below ∈=0.001 even after L=3 stages.

Figure 3:
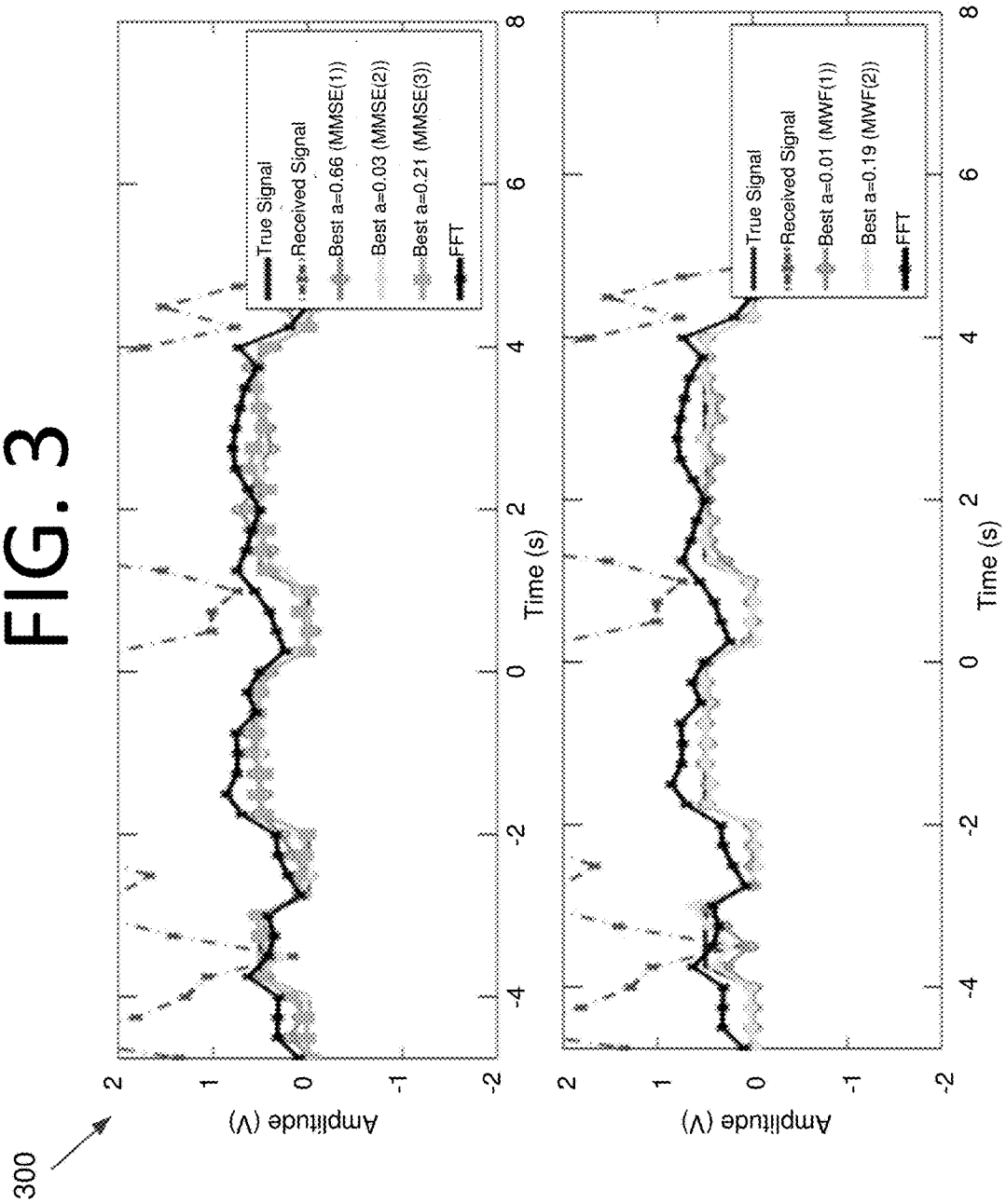
FIG. 3 illustrates graphs 300 showing signal amplitude over time for the best a values produced by repeated MMSE-FrFT filters and MMSE-FFT filters (upper graph) versus the MMSE-MWF-FrFT approach (lower graph) according to an embodiment of the present invention, where $E_b/N_0=0$ dB.

Graphs 300 of FIG. 3 show an example with $E_b/N_0$=0 dB. The errors for the conventional MMSE-FrFT and MMSE-FFT filters are MMSE-FrFT(1)=0.0116, MMSE-FrFT(2)=0.0043, MMSE-FrFT(3)=0.0038, and MMSE-FFT=0.0537. For the CSA-MWF, MMSE-MWF-FrFT(1)=0.0033, and MMSE-MWF-FrFT(2)=3.72×10$^{-6}$. From the MSE calculations, again note the significant improvement in error using the CSA-MWF. Orders of magnitude improvement are still achieved even with the lower $E_b/N_0$, and the result is as good as in the previous example because this scenario is only limited by the time-varying channel response, which the algorithm removes. The noise is channel noise that is lowpass filtered according to Eq. (18).

Figure 4:
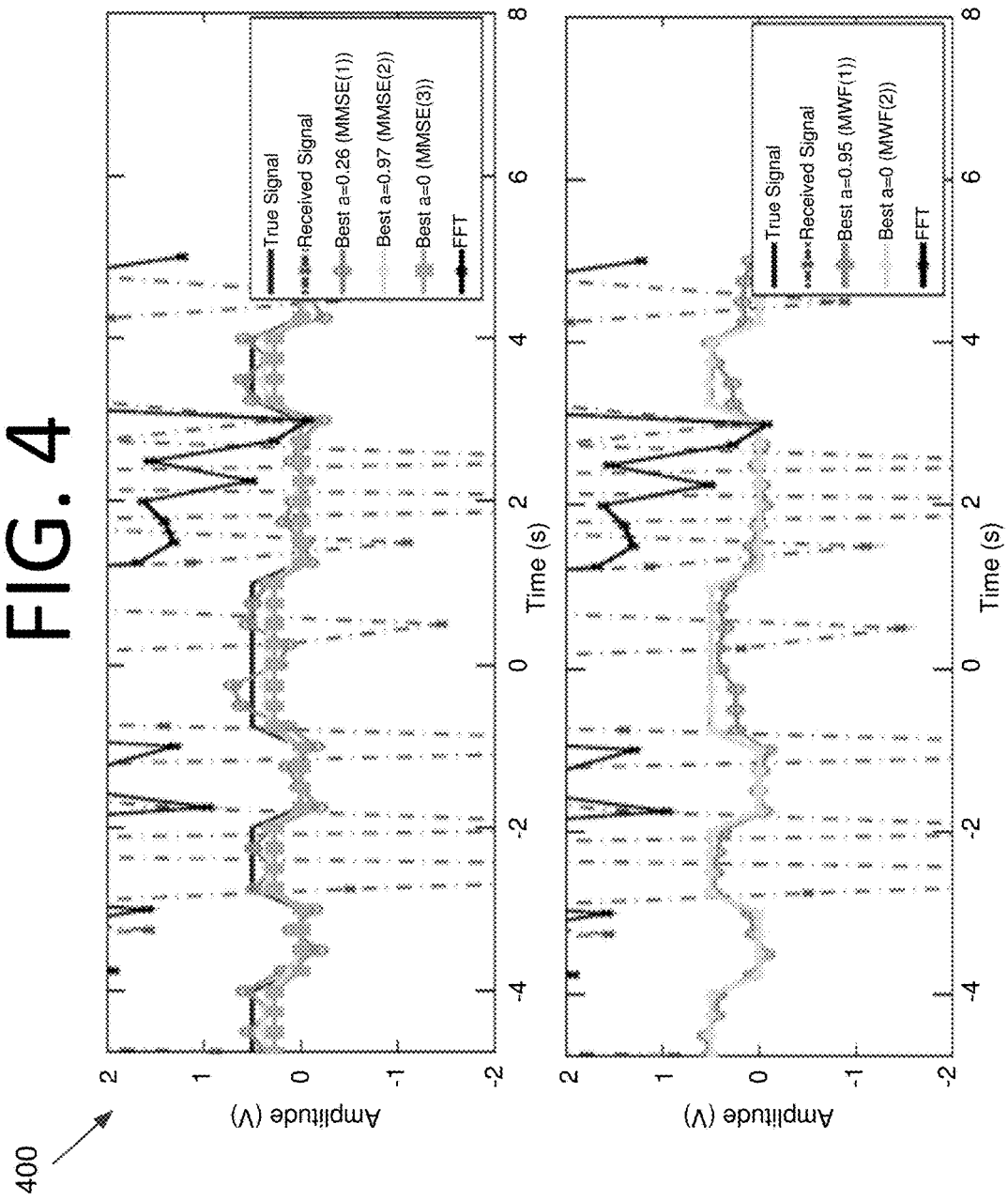
FIG. 4 illustrates graphs 400 showing signal amplitude over time for the best a values produced by repeated MMSE-FrFT filters and MMSE-FFT filters (upper graph) versus the MMSE-MWF-FrFT approach (lower graph) according to an embodiment of the present invention, where $E_b/N_0=20$ dB.

In graphs 400 of FIG. 4, $E_b/N_0$=20 dB. This is an extreme case where most processing methods would fail. Here, MMSE-FrFT(1)=0.0247, MMSE-FrFT(2)=0.0143, MMSE-FrFT(3)=0.0252, and MMSE-FFT=9.65. A significant degradation in performance of the two conventional filtering algorithms is seen due to the very low $E_b/N_0$. In fact, this is the first example where the MMSE-FrFT error grows as/increases. This is because MMSE filtering is suboptimum in non-stationary channels with few samples and cannot converge. The CSA-MWF yields MMSE-MWFFrFT(1)=0.014 and MMSE-MWF-FrFT(2)=3.39×10$^{-5}$. The proposed MMSE-MWF-FrFT method again outperforms MMSE-FrFT. Note the poor performance of frequency domain filtering (i.e. MMSE-FFT) alone. Further note that only two stages are still required for the CSA-MWF here, with excellent performance results. Three or more stages may occasionally be required, however.

For the remaining examples, the channel is not included. Instead, the effects of interference and additive WGN (AWGN) are included. First, it is assumed that there is an interfering chirp signal present given by $$x_I(i)=A_I e^{-j\pi(i/f_s)^2} \quad (19)$$

where the chirp amplitude $A_I$ is the strength of the interfering obtained by setting its mean amplitude based upon a desired carrier-to-interference ratio (CIR), and the amplitude of the AWGN is again set based upon a desired $E_b/N_0$. Specifically, the amplitude of the SIM is set to A=1/$\sqrt{SPB}$ and the amplitude of the interferer is set to $A_I$=10$^{-CIR/20}$, where the CIR is given in dB. Note that a negative CIR means that the interferer is stronger than the SOL The amplitude of the AWGN is further set to be $\sigma_N=\sqrt{1/(2\times10^{(E_b/N_0)/10})}$.

Figure 5:
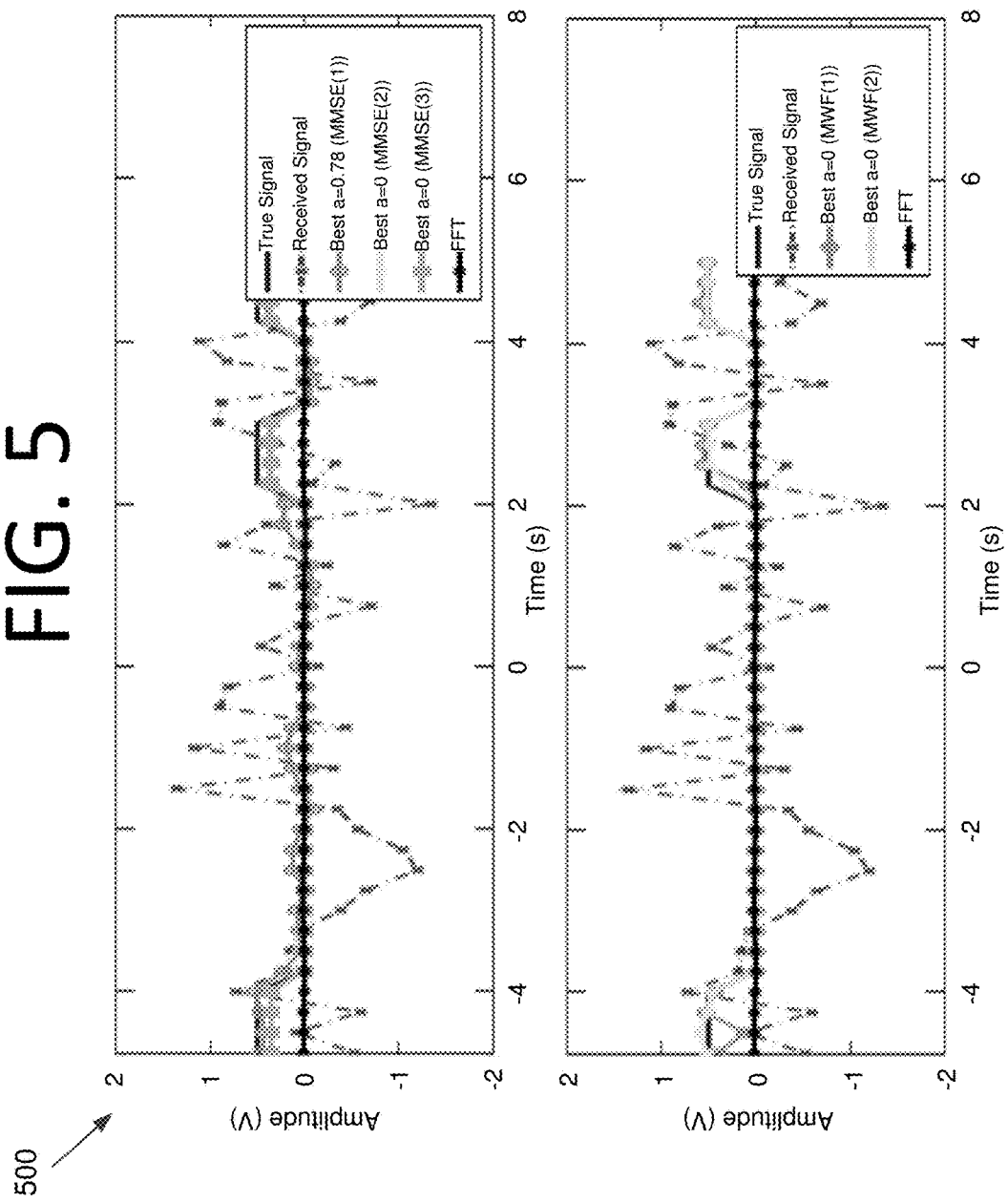
FIG. 5 illustrates graphs 500 showing signal amplitude over time for the best a values produced by repeated MMSE-FrFT filters and MMSE-FFT filters (upper graph) versus the MMSE-MWF-FrFT approach (lower graph) according to an embodiment of the present invention, with a chirp interferer where $E_b/N_0=10$ dB and CIR=5 dB.
Figure 6:
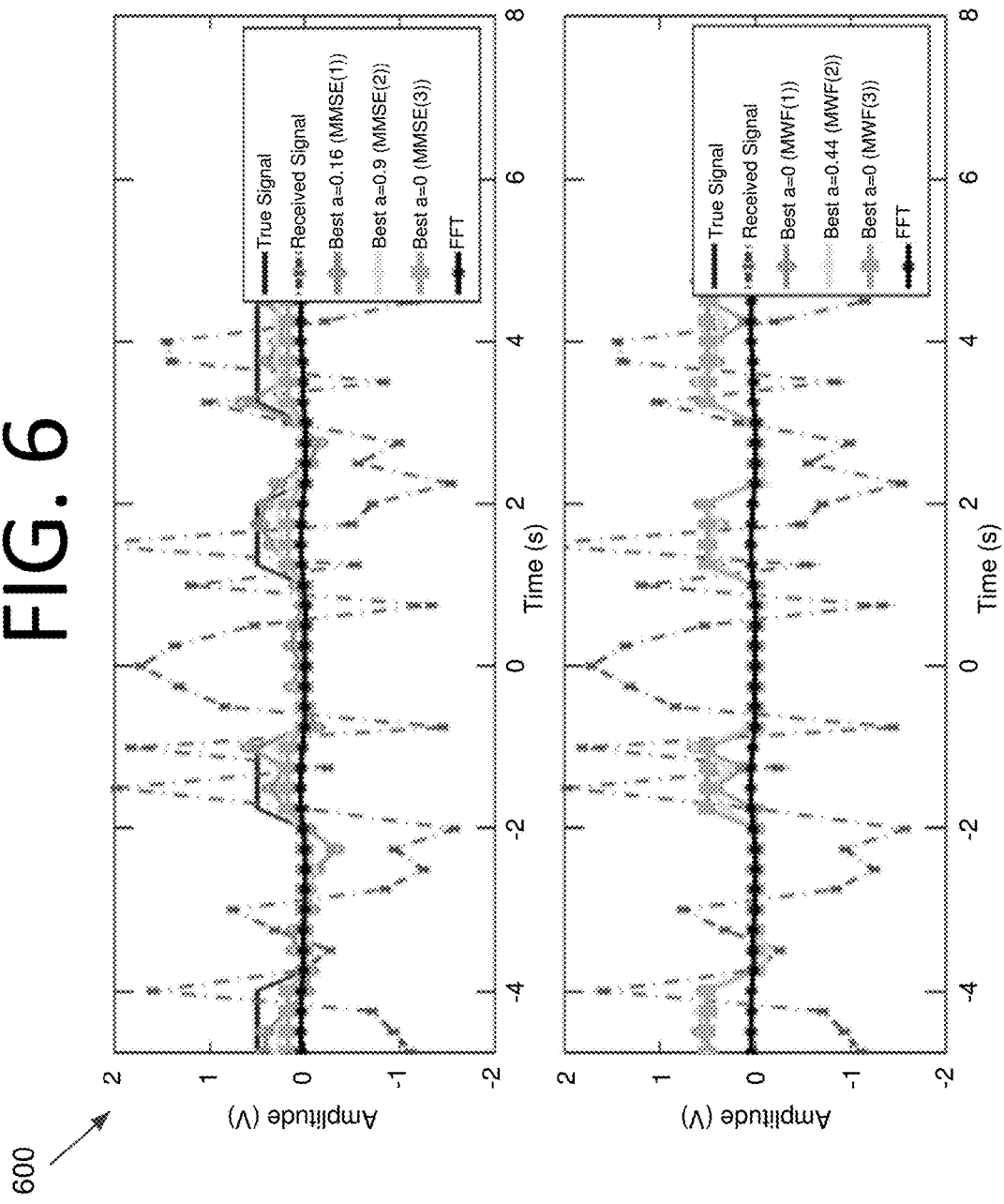
FIG. 6 illustrates graphs 600 showing signal amplitude over time for the best a values produced by repeated MMSE-FrFT filters and MMSE-FFT filters (upper graph) versus the MMSE-MWF-FrFT approach (lower graph) according to an embodiment of the present invention, with a chirp interferer where $E_b/N_0=10$ dB and CIR=0 dB.

Recall that SPB, the number of samples per bit, is set to 4. In the examples in graphs 500 and 600 of FIGS. 5 and 6, respectively, the chirp interferer and CIR=5 and 0 dB are used, respectively. $E_b/N_0$ is kept at 10 dB. The computed MSEs when CIR=5 dB are MMSE-FrFT(1)=0.0107, MMSE-FrFT(2)=0.0065, MMSE-FrFT(3)=0.0065, MMSE-FFT=0.0715, MMSE-MWF-FrFT(1)=0.0088, and MMSE-MWF-FrFT(2)=0.0013. Note that the repeated MMSE filtering method cannot reduce the MSE down below E in this case. Also note that had L been equal to 3, then MMSE-MWF-FrFT(3)=4.62×10$^{-10}$, which is an excellent result. However, L=2 was close to a low enough MSE that the L=3 signal estimate was not shown. When CIR=0 dB, likewise, MMSE-FrFT(1)=0.0329, MMSE-FrFT(2)=0.0315, MMSE-FrFT(3)=0.0518, MMSE-FFT=0.1076, MMSE-MWF-FrFT(1)=0.0163, MMSE-MWF-FrFT(2)=0.0058, and MMSE-MWF-FrFT(3)=1.63×10$^{-5}$. Now, L=3 stages are required for a good MSE in the repeated MMSE-MWF-FrFT algorithm, but excellent MSE is still achieved with few stages. Note that the repeated MMSE-FrFT filtering method fails now to produce MSEs close to 0.001.

Figure 7:
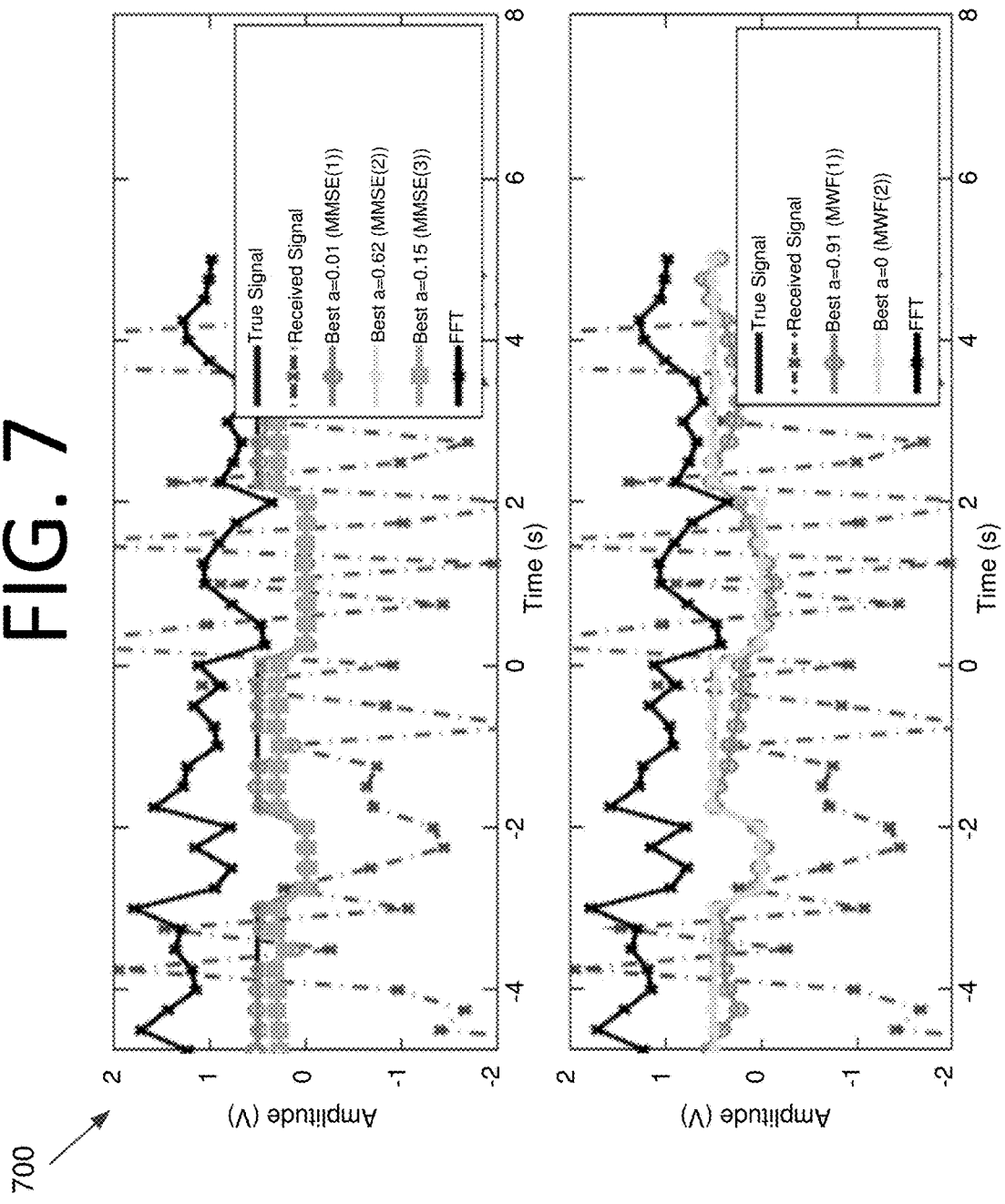
FIG. 7 illustrates graphs 700 showing signal amplitude over time for the best a values produced by repeated MMSE-FrFT filters and MMSE-FFT filters (upper graph) versus the MMSE-MWF-FrFT approach (lower graph) according to an embodiment of the present invention, with a chirp interferer where $E_b/N_0=0$ dB and CIR=0 dB.

In graphs 700 of FIG. 7, $E_b/N_0$=0 dB and CIR=0 dB. Now, MMSE-FrFT(1)=0.0117, MMSE-FrFT(2)=0.0211, MMSE-FrFT(3)=0.0334, MMSE-FFT=0.5268, MMSE-MWF-FrFT(1)=0.0241, and MMSE-MWF-FrFT(2)=1.88×10$^{-4}$, so convergence occurs after only L=2 stages. Note that after L=3 stages, MMSE-MWF-FrFT(3)=3.73×10$^{-13}$. Again, the repeated MMSE-FrFT algorithm fails while the MMSE-MWF-FrFT algorithm still works well.

Figure 8:
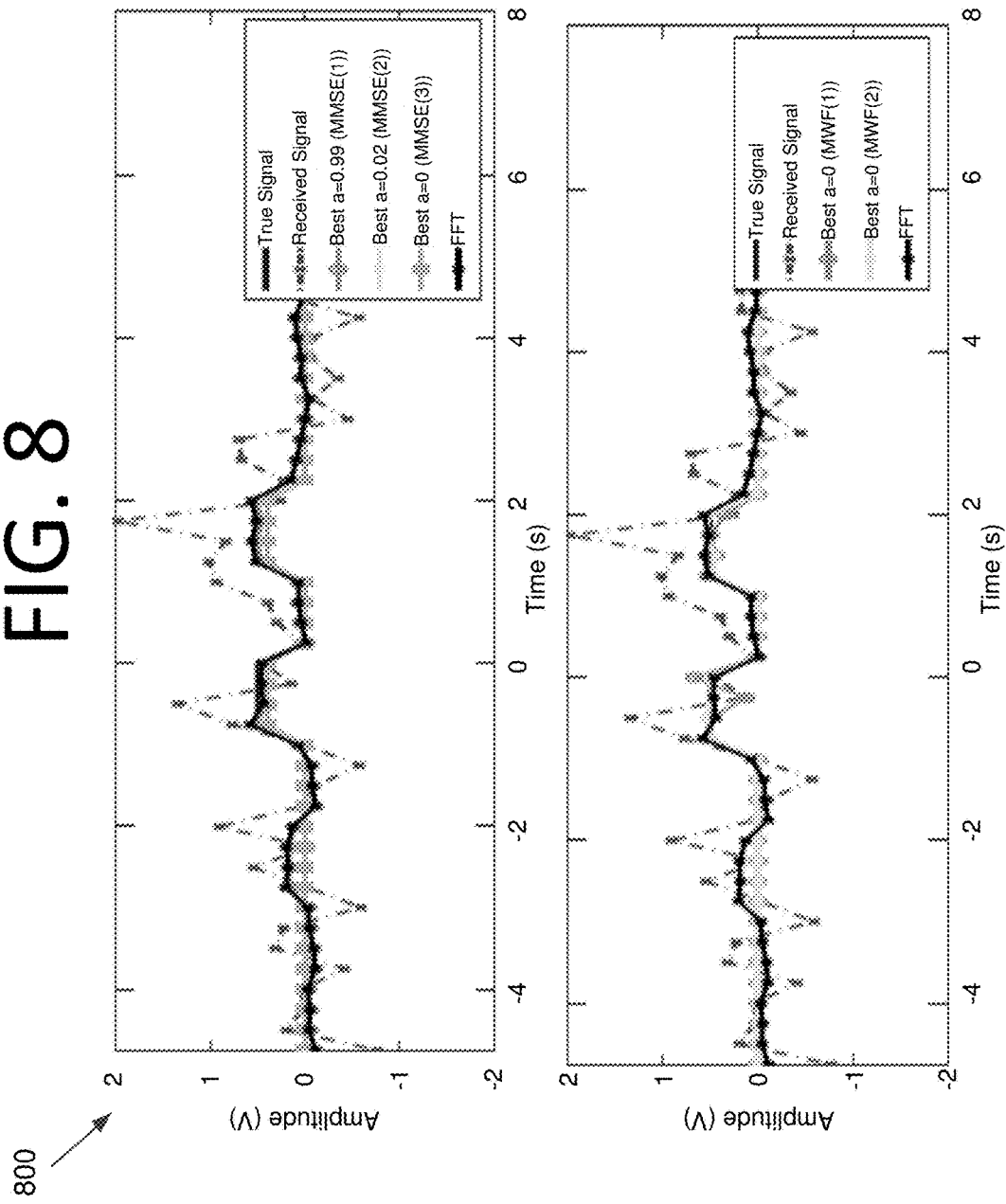
FIG. 8 illustrates graphs 800 showing signal amplitude over time for the best a values produced by repeated MMSE-FrFT filters and MMSE-FFT filters (upper graph) versus the MMSE-MWF-FrFT approach (lower graph) according to an embodiment of the present invention, with a Gaussian pulse interferer where $E_b/N_0=10$ dB and CIR=5 dB.
Figure 9:
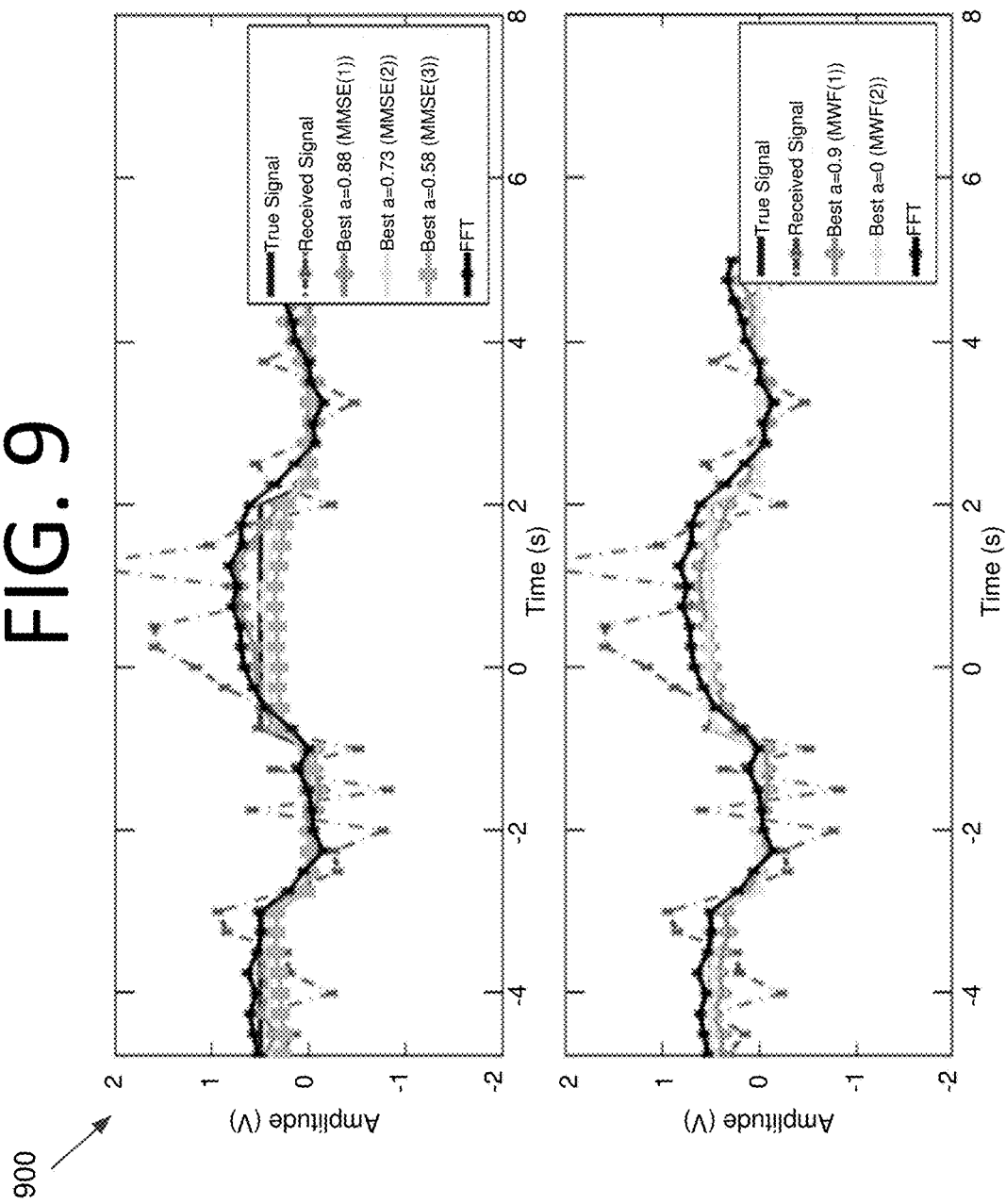
FIG. 9 illustrates graphs 900 showing signal amplitude over time for the best a values produced by repeated MMSE-FrFT filters and MMSE-FFT filters (upper graph) versus the MMSE-MWF-FrFT approach (lower graph) according to an embodiment of the present invention, with a Gaussian pulse interferer where $E_b/N_0=10$ dB and CIR=0 dB.

An interferer in the form of a Gaussian pulse is now used, given by $$x_I(i)=A_I\beta e^{-\pi(i/f_s-\phi)^2} \quad (20)$$

where $\beta$, uniformly distributed in (0.5, 1.5), and $\phi$ are the amplitude and phase, respectively, and CIR is set to 5 dB. It is also again assumed that AWGN is present in the received signal. All other parameters are the same as before. In graphs 800 and 900 of FIGS. 8 and 9, the Gaussian interferer is used and CIR=5 and 0 dB, respectively. $E_b/N_0$ is again kept at 10 dB. This is because these examples are used to learn how well the algorithms suppress nonstationary interference, as they are designed to do. The computed MSEs when CIR=5 dB are MMSE-FrFT(1)=0.0063, MMSE-FrFT(2)=0.0021, MMSE-FrFT(3)=0.0023, MMSE-FTT=0.0076, MMSE-MWF-FrFT(1)=0.005, and MMSE-MWF-FrFT(2)=1.65×10$^{-4}$. Once again, repeated MMSE-FrFT filtering does not quite achieve 0.001 MSE, even though it comes close, but the repeated MMSE-MWF-FrFT does well below this in just L=2 iterations.

When CIR=0 dB, MMSE-FrFT(1)=0.0123, MMSE-FrFT(2)=0.0087, MMSE-FrFT(3)=0.0202, MMSE-FFT=0.0287, MMSE-MWF-FrFT(1)=0.0121, and MMSE-MWF-FrFT(2)= 2.15×10$^{-4}$. If the repeated MMSE-MWF-FrFT algorithm was run to L=3 stages, MMSE-MWF-FrFT(3) would be 2.59×10$^{-12}$. However, only L=2 stages are required in the repeated MMSE-MWF-FrFT algorithm, with excellent MSE results. Note that the repeated MMSE-FrFT filtering method again fails now to produce MSEs close to 0.001 after L=3 stages. Using L>3 stages does not cause the MSE to improve for the MMSE-FrFT, and for computational speed, it is desirable to keep L small.

Figure 10:
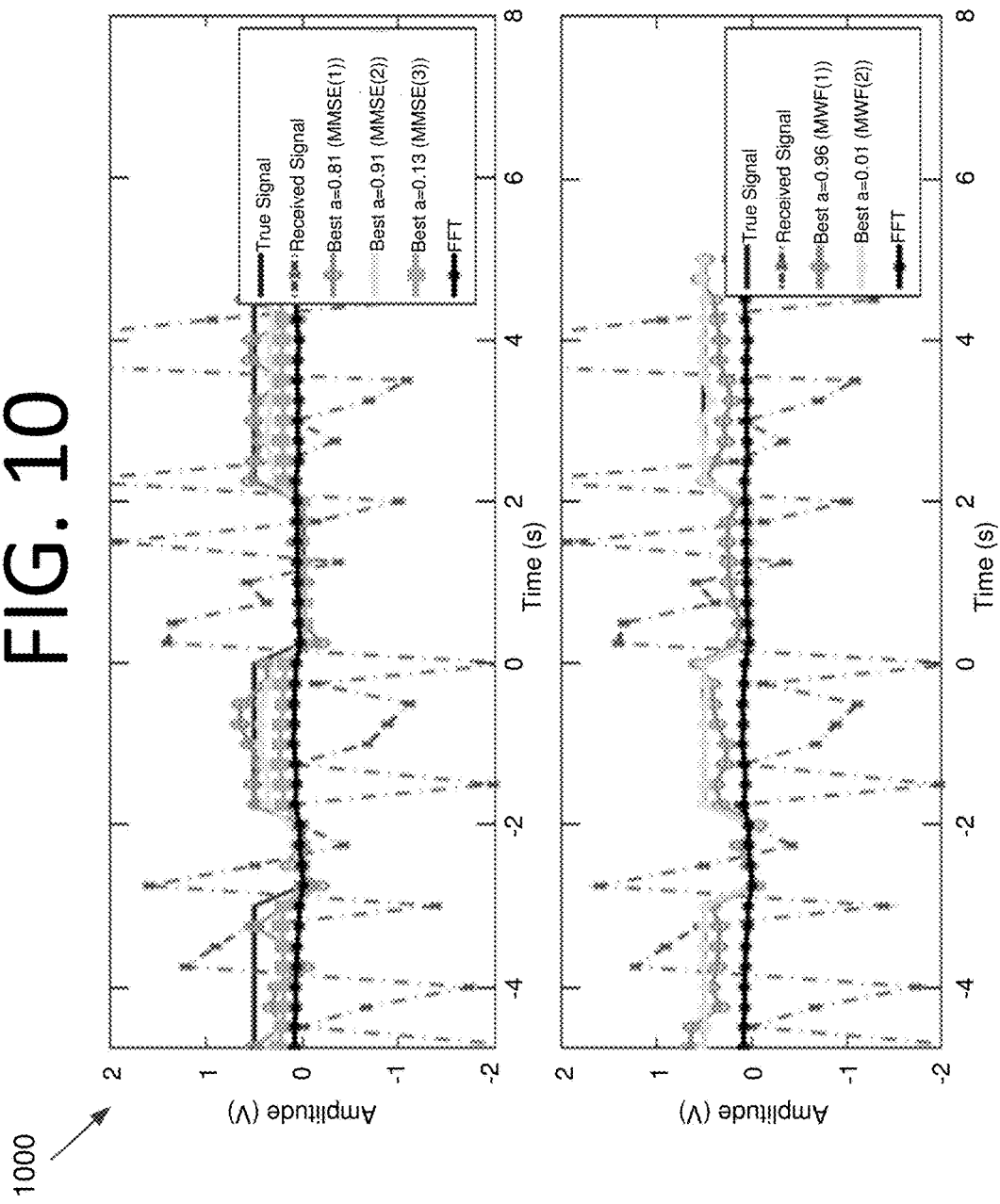
FIG. 10 illustrates graphs 1000 showing signal amplitude over time for the best a values produced by repeated MMSE-FrFT filters and MMSE-FFT filters (upper graph) versus the MMSE-MWF-FrFT approach (lower graph)

Graphs 1000 of FIG. 10 have $E_b/N_0$=0 dB and a Gaussian pulse interferer at CIR=0 dB. The repeated MMSE-MWF-FrFT algorithm still requires just L=2 iterations, and MMSE-FrFT(1)=0.0337, MMSE-FrFT(2)=0.0292, MMSE-FrFT (3)=0.0602, MMSE-FFT=0.1328, MMSE-MWF-FrFT(1)=0.0261, and MMSE-MWF-FrFT(2)=2.65×10$^{-4}$. The repeated MMSE algorithm fails to converge now, but the repeated MMSE-MWF-FrFT algorithm continues to perform well. Similar performance is achieved with the chirp interferer and time-varying channel at low $E_b/N_0$. Note that other types of interference could be studied as well, but would also produce good results.

FIG. 11 is a flowchart 1100 illustrating a process for performing repeated reduced rank adaptive filtering with a MMSE-MWF-FrFT approach, according to an embodiment of the present invention. The process begins with initializing the filter by setting l=1 and y(i,l)=y(i) at 1110. Recall from Eq. (10) that the received signal y(i)=(x(i)*h(i))+$x_I$(i)+n(i). In some embodiments, the transmitter of the received signal is non-stationary due to movement, Doppler shift, time-varying signals or channels, drifting frequencies, or any combination thereof. In certain embodiments, the received signal cannot be separated in the time domain or the frequency domain alone.

Next, the MMSE filter coefficients are computed over all a for a current optimum filter at 1120. This includes setting the number of filter stages D to a number sufficiently smaller than N, where N is the number of samples per block in the BPSK signal, that rank reduction is achieved. Furthermore, all variables are transformed to the FrFT domain, searching over all a.

The best a for the current optimum filter and the MMSE are computed at 1130. Once this is done, the received signal is updated using the best a and associated filter coefficients, based on the smallest MMSE, at 1140. If the error result for MMSE-MWF-FrFT(l) is less than or equal to a desired error threshold $\in$ (e.g., 0.001) at 1150, then the received signal has been sufficiently filtered and the SOI (e.g., a cellular communication signal, a satellite communication signal, a radar signal, an image signal, a speech signal, or any combination thereof) is extracted from the updated received signal at 1160. However, if this is not the case at 1150, l is incremented and the process returns to step 1120 to repeal the process for l=2, l=3, etc. However, in most cases, no more than two stages are required, and in nearly all cases, no more than three stages are required. As such, the interference suppression and signal separation can accurately be performed in most embodiments sufficiently fast that the process is not human-perceptible. While times of less than one second (approximately 0.5 seconds for two iterations and approximately 0.75 seconds for three iterations using Matlab™), these times could be sped up using a faster processor, such as a field programmable gate array (FPGA).

Some embodiments of the present invention provide an algorithm that uses repeated reduced rank adaptive filtering using the correlations subtraction architecture of the multi-stage Wiener filter (CSA-MWF) in the FrFT domains Such an approach improves upon signal demodulation in non-stationary interference over conventional single stage MMSE-FrFT, repeated MMSE-FrFT, and MMSE-FFT algorithms Mean-square error (MSE) is used to determine when to stop iterating, and the signal estimate is updated at each iteration. While $\in$=0.001 was chosen for the examples herein, any desired value of E may be used without deviating from the scope of the invention. The proposed approach is shown to outperform conventional methods and provides one or more orders of magnitude improvement in MSE after just two or three iterations, even at low $E_b/N_0$ or low carrier-to-interference ratio (CIR). Such an algorithm is more straightforward to implement than other techniques that rely on iterating or performing matrix inversions. The rank of the CSA-MWF can also be kept small. The algorithm of some embodiments offers promise for pulling very weak signals out of interference, clutter, and noise in real world, dynamic environments.

FIG. 12 illustrates a computing system 1200 configured to perform repeated reduced rank adaptive filtering with a MMSE-MWF-FrFT approach, according to an embodiment of the present invention. System 1200 includes a bus 1205 or other communication mechanism for communicating information, and processor(s) 1210 coupled to bus 1205 for processing information. Processor(s) 1210 may be any type of general or specific purpose processor, including a central processing unit (CPU) or application specific integrated circuit (ASIC). Processor(s) 1210 may also have multiple processing cores, and at least some of the cores may be configured for specific functions. System 1200 further includes a memory 1215 for storing information and instructions to be executed by processor(s) 1210. Memory 1215 can be comprised of any combination of random access memory (RAM), read only memory (ROM), flash memory, cache, static storage such as a magnetic or optical disk, or any other types of non-transitory computer-readable media or combinations thereof. Additionally, system 1200 includes a communication device 1220, such as a transceiver, to wirelessly provide access to a communications network. Communication device 1220 may receive a signal including the SOI and interference/noise.

Non-transitory computer-readable media may be any available media that can be accessed by processor(s) 1210 and may include both volatile and non-volatile media, removable and non-removable media, and communication media. Communication media may include computer-readable instructions, data structures, program modules or other data in a modulated data signal such as a carrier wave or other transport mechanism and includes any information delivery media.

Processor(s) 1210 are further coupled via bus 1205 to a display 1225, such as a Liquid Crystal Display (LCD), for displaying information to a user. A keyboard 1230 and a cursor control device 1235, such as a computer mouse, are further coupled to bus 1205 to enable a user to interface with system 1200. However, in certain embodiments such as those for mobile computing implementations, a physical keyboard and mouse may not be present, and the user may interact with the device solely through display 1225 and/or a touchpad (not shown). Any type and combination of input devices may be used as a matter of design choice.

In one embodiment, memory 1215 stores software modules that provide functionality when executed by processor(s) 1210. The modules include an operating system 1240 for system 1200. The modules further include a MMSE-MWF-FrFT module 1245 that is configured to configured to perform repeated reduced rank adaptive filtering with a MMSE-MWF-FrFT approach. System 1200 may include one or more additional functional modules 1250 that include additional functionality.

One skilled in the art will appreciate that a "system" could be embodied as a personal computer, a server, a console, a personal digital assistant (PDA), a cell phone, a tablet computing device, or any other suitable computing device, or combination of devices. Presenting the above-described functions as being performed by a "system" is not intended to limit the scope of the present invention in any way, but is intended to provide one example of many embodiments of the present invention. Indeed, methods, systems and apparatuses disclosed herein may be implemented in localized and distributed forms consistent with computing technology, including cloud computing systems.

It should be noted that some of the system features described in this specification have been presented as modules, in order to more particularly emphasize their implementation independence. For example, a module may be implemented as a hardware circuit comprising custom very large-scale integration (VLSI) circuits or gate arrays, off-the-shelf semiconductors such as logic chips, transistors, or other discrete components. A module may also be implemented in programmable hardware devices such as field programmable gate arrays, programmable array logic, programmable logic devices, graphics processing units, or the like.

A module may also be at least partially implemented in software for execution by various types of processors. An identified unit of executable code may, for instance, comprise one or more physical or logical blocks of computer instructions that may, for instance, be organized as an object, procedure, or function. Nevertheless, the executables of an identified module need not be physically located together, but may comprise disparate instructions stored in different locations which, when joined logically together, comprise the module and achieve the stated purpose for the module. Further, modules may be stored on a computer-readable medium, which may be, for instance, a hard disk drive, flash device, RAM, tape, or any other such medium used to store data.

Indeed, a module of executable code could be a single instruction, or many instructions, and may even be distributed over several different code segments, among different programs, and across several memory devices. Similarly, operational data may be identified and illustrated herein within modules, and may be embodied in any suitable form and organized within any suitable type of data structure. The operational data may be collected as a single data set, or may be distributed over different locations including over different storage devices, and may exist, at least partially, merely as electronic signals on a system or network.

The process steps performed in FIG. 11 may be performed by a computer program, encoding instructions for the nonlinear adaptive processor to perform at least the process described in FIG. 11, in accordance with embodiments of the present invention. The computer program may be embodied on a non-transitory computer-readable medium. The computer-readable medium may be, but is not limited to, a hard disk drive, a flash device, RAM, a tape, or any other such medium used to store data. The computer program may include encoded instructions for controlling the nonlinear adaptive processor to implement the process described in FIG. 11, which may also be stored on the computer-readable medium.

The computer program can be implemented in hardware, software, or a hybrid implementation. The computer program can be composed of modules that are in operative communication with one another, and which are designed to pass information or instructions to display. The computer program can be configured to operate on a general-purpose computer, or an ASIC.

It will be readily understood that the components of various embodiments of the present invention, as generally described and illustrated in the figures herein, may be arranged and designed in a wide variety of different configurations. Thus, the detailed description of the embodiments of the systems, apparatuses, methods, and computer programs of the present invention, as represented in the attached figures, is not intended to limit the scope of the invention as claimed, but is merely representative of selected embodiments of the invention.

The features, structures, or characteristics of the invention described throughout this specification may be combined in any suitable manner in one or more embodiments. For example, reference throughout this specification to "certain embodiments," "some embodiments," or similar language means that a particular feature, structure, or characteristic described in connection with the embodiment is included in at least one embodiment of the present invention. Thus, appearances of the phrases "in certain embodiments," "in some embodiment," "in other embodiments," or similar language throughout this specification do not necessarily all refer to the same group of embodiments and the described features, structures, or characteristics may be combined in any suitable manner in one or more embodiments.

It should be noted that reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussion of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize that the invention can be practiced without one or more of the specific features or advantages of a particular embodiment. In other instances, additional features and advantages may be recognized in certain embodiments that may not be present in all embodiments of the invention.

One having ordinary skill in the art will readily understand that the invention as discussed above may be practiced with steps in a different order, and/or with hardware elements in configurations which are different than those which are disclosed. Therefore, although the invention has been described based upon these preferred embodiments, it would be apparent to those of skill in the art that certain modifications, variations, and alternative constructions would be apparent, while remaining within the spirit and scope of the invention. In order to determine the metes and bounds of the invention, therefore, reference should be made to the appended claims.

The invention claimed is:

1. A computer-implemented method of performing repeated reduced rank MMSE-MWF-FrFT filtering, comprising:

computing, by a computing system, minimum mean-square error (MMSE) filter coefficients over all a for a current optimum filter to be applied to a received signal, where a is a rotational parameter;

computing, by the computing system, a best a for the current filter and a current smallest MMSE;

updating the received signal, by the computing system, using the current smallest MMSE;

when the current smallest MMSE is not less than or equal to an error threshold, repeating, by the computing system, the computation of the MMSE filter coefficients, the computation of the best a and the current smallest MMSE, and the updating of the received signal using the current smallest MMSE until the current smallest MMSE is less than or equal to the error threshold; and when the current smallest MMSE is less than or equal to the error threshold, extracting a signal-of-interest (SOI), by the computing system, from the updated received signal.

2. The computer-implemented method of claim 1, wherein a number of iterations L of computing the MMSE filter coefficients, computing the best a and the current smallest MMSE, and updating the received signal using the current smallest MMSE is at least two.

3. The computer-implemented method of claim 1, wherein
when the error threshold is reached or exceeded, L sets of a values and filter weights are provided to be applied to data in the received signal following a training sequence, where L is a number of iterations, and
the SOI is extracted from the updated received signal using the L sets of a values and filter weights.

4. The computer-implemented method of claim 1, wherein the computing of the MMSE filter coefficients further comprises setting a number of filter stages D to a number sufficiently smaller than a number of samples per block N that rank reduction is achieved.

5. The computer-implemented method of claim 1, wherein the computing of the MMSE filter coefficients further comprises transforming all variables to a fractional Fourier transformation (FrFT) domain.

6. The computer-implemented method of claim 1, wherein the error threshold is 0.001 or less.

7. The computer-implemented method of claim 1, wherein the repeated reduced rank adaptive filtering is performed using a correlations subtraction architecture of a multistage Wiener filter (CSA-MWF) in the fractional Fourier transformation (FrFT) domain.

8. The computer-implemented method of claim 7, wherein the CSA-MWF computes the D scalar weights $w_j$, j=1, 2, . . . , D, from which the current optimum filter is formed, and the current optimum filter is given by:

$$g_{0,MMSE\text{-}MWF\text{-}FrFT}(l) = w_1(l)h_1(l) - w_1(l)w_2(l)h_2(l) + \ldots -(-1)^D w_1(l)w_2(l) \ldots w_D(l)h_D(l).$$

9. The computer-implemented method of claim 8, wherein forward recursion for the filter coefficients for j=1, 2, . . . , D is determined by:

$$h_j(l) = (\Sigma_\Omega\{d^*_{j-1}(i,l)x_{j-1}(i,l)\})/(\|\Sigma_\Omega\{d^*_{j-1}(i,l)x_{j-1}(i,l)\}\|)$$

$$d_j(i,l) = h_j^H(l)x_{j-1}(i,l)$$

$$x_j(i,l) = x_{j-1}(i,l) - h_j(l)d_j(i,l)$$

and backward recursion for the filter coefficients for j=D, D-1, . . . , 1 is determined by $$\in_D(l) = d_D(i)$$

$$w_j(l) = (\Sigma_\Omega\{d^*_{j-1}(i,l)\in_j(i,l)\})/(\Sigma_\Omega\{|\in_j(i,l)|^2\})$$

$$\in_{j-1}(i,l) = d_{j-1}(i,l) - w^*_j(l)\in_j(i,l).$$

10. The computer-implemented method of claim 1, wherein the repeated reduced rank MMSE-MWF-FrFT filtering realizes improved signal demodulation over single stage MMSE-FrFT, repeated MMSE-FrFT, and MMSE-FFT algorithms by at least on order of magnitude.

11. The computer-implemented method of claim 1, wherein the SOI comprises a cellular communication signal, a satellite communication signal, a radar signal, an image signal, a speech signal, or any combination thereof.

12. The computer-implemented method of claim 1, wherein a transmitter of the received signal is non-stationary due to movement, Doppler shift, time-varying signals, time-varying channels, drifting frequencies, or any combination thereof.

13. The computer-implemented method of claim 1, wherein the received signal cannot be separated in either a time domain or a frequency domain alone.

14. The computer-implemented method of claim 1, wherein the current smallest MMSE is computed by:

$$MMSE\ FrFT(l) = \underset{a(l)}{\arg\min} \frac{1}{M}\sum_{i=1}^{M} \|\hat{x}_{MWF}(i,l) - x(i)\|^2$$

where $$\hat{x}_{MWF}(i,l) F^{-a(l)} G_{0,MMSE\text{-}MWF\text{-}FrFT}(i,l) F^{a(l)} y(i,l)$$

and $$g_{0,MMSE\text{-}MWF\text{-}FrFT}(l) = w_1(l)h_1(l) - w_1(l)w_2(l)h_2(l) + \ldots -(-1)^D w_1(l)w_2(l) \ldots w_D(l)h_D(l).$$

15. A computer program configured to perform repeated reduced rank MMSE-MWF-FrFT filtering embodied on a non-transitory computer-readable medium, the program configured to cause at least one processor to:
(1) compute minimum mean-square error (MMSE) filter coefficients over all values of a rotational parameter a for a current optimum filter to be applied to a received signal;
(2) compute a best value of a and compute a current smallest MMSE;
(3) update the received signal using the current smallest received signal; and
(4) while the current smallest MMSE is greater than an error threshold, repeat steps (1)-(3) until the current smallest MMSE is less than or equal to the error threshold, wherein
when the error threshold is reached or exceeded, L sets of a values and filter weights are provided to be applied to data in the received signal following a training sequence.

16. The computer program of claim 15, wherein when the current smallest MMSE is less than or equal to the error threshold, the program is further configured to cause the at least one processor to extract a signal-of-interest (SOI) from the updated received signal using the L sets of a values and filter weights.

17. The computer program of claim 15, wherein the computing of the MMSE filter coefficients further comprises setting a number of filter stages D to a number sufficiently smaller than a number of samples per block N that rank reduction is achieved.

18. The computer program of claim 15, wherein the computing of the MMSE filter coefficients further comprises transforming all variables to a fractional Fourier transformation (FrFT) domain.

19. The computer program of claim 15, wherein the error threshold is 0.001 or less.

20. The computer program of claim 15, wherein the repeated reduced rank adaptive filtering is performed using a correlations subtraction architecture of a multistage Wiener filter (CSA-MWF) in the fractional Fourier transformation (FrFT) domain.

21. The computer program of claim 20, wherein the CSA-MWF computes the D scalar weights $w_j$, j=1, 2, . . . , D, from which the current optimum filter is formed, and the current optimum filter is given by:

$$g_{0,MMSE\text{-}MWF\text{-}FrFT}(l) = w_1(l)h_1(l) - w_1(l)w_2(l)h_2(l) + \ldots -(-1)^D w_1(l)w_2(l) \ldots w_D(l)h_D(l).$$

22. The computer program of claim 15, wherein forward recursion for the filter coefficients for j=1, 2, . . . , D is determined by:

$$h_j(l)=(\Sigma_\Omega\{d^*_{j-1}(i,l)x_{j-1}(i,l)\})/(\|\Sigma_\Omega\{d^*_{j-1}(i,l)x_{j-1}(i,l)\}\|)$$

$$d_j(i,l)=h_j^H(l)x_{j-1}(i,l)$$

$$x_j(i,l)=x_{j-1}(i,l)-h_j(l)d_j(i,l)$$

and backward recursion for the filter coefficients for j=D, D−1, . . . , 1 is determined by $$\in_D(i)=d_D(i)$$

$$w_j(l)=(\Sigma_\Omega\{d^*_{j-1}(i,l)\in_j(i,l)\})/(\Sigma_\Omega\{|\in_j(i,l)|^2\})$$

$$\in_{j-1}(i,l)=d_{j-1}(i,l)-w^*_j(l)\in_j(i,l).$$

23. The computer program of claim 15, wherein the repeated reduced rank MMSE-MWF-FrFT filtering realizes improved signal demodulation over single stage MMSE-FrFT, repeated MMSE-FrFT, and MMSE-FFT algorithms by at least on order of magnitude.

24. The computer program of claim 15, wherein the current smallest MMSE is computed by:

$$MMSE\ FrFT(l) = \operatorname*{argmin}_{a(l)} \frac{1}{M}\sum_{i=1}^{M} \|\hat{x}_{MWF}(i, l) - x(i)\|^2$$

where $$\hat{x}_{MWF}(i,l)=F^{-a(l)}G_{0,MMSE-MWF-FrFT}(i,l)F^{a(l)}y(i,l)$$

and $$g_{0,MMSE-MWF-FrFT}(l)=w_1(l)h_1(l)-w_1(l)w_2(l)h_2(l)+ \ldots -(-1)^D w_1(l)w_2(l)\ldots w_D(l)h_D(l).$$

25. A computing system, comprising:
memory storing computer program instructions for performing repeated reduced rank MMSE-MWF-FrFT filtering; and
at least one processor configured to execute the computer program instructions, wherein the instructions, together with the at least one processor, are configured to cause the apparatus to:
apply reduced rank MMSE-MWF-FrFT filtering to a received signal for at least one stage L, obtaining a current smallest MMSE at each stage, and
when the current smallest MMSE is less than or equal to an error threshold, extract a signal-of-interest (SOI) from the updated received signal, wherein
when the error threshold is reached or exceeded, L sets of a values and filter weights are provided to be applied to data in the received signal following a training sequence to extract the SOI from the received signal.

26. The computing system of claim 25, wherein the MMSE-MWF-FrFT filtering comprises: computing MMSE filter coefficients over all a for a current optimum filter to be applied to a received signal, where a is a rotational parameter; computing a best a for the current filter and a current smallest MMSE; and updating the received signal using the current smallest MMSE.

27. The computing system of claim 26, wherein the computing of the MMSE filter coefficients further comprises setting a number of filter stages D to a number sufficiently smaller than a number of samples per block N that rank reduction is achieved.

28. The computing system of claim 27, wherein the computing of the MMSE filter coefficients further comprises transforming all variables to a fractional Fourier transformation (FrFT) domain.

29. The computing system of claim 25, wherein the error threshold is 0.001 or less.

30. The computing system of claim 25, wherein L is at least two.

31. The computing system of claim 25, wherein the repeated reduced rank MMSE-MWF-FrFT filtering realizes improved signal demodulation over single stage MMSE-FrFT, repeated MMSE-FrFT, and MMSE-FFT algorithms by at least on order of magnitude.

* * * * *